United States Patent [19]

Müller

[11] Patent Number: 5,406,205

[45] Date of Patent: Apr. 11, 1995

[54] GRADIENT-GENERATION SYSTEM, NUCLEAR SPIN TOMOGRAPH, AND PROCESS FOR THE GENERATION OF IMAGES WITH A NUCLEAR-SPIN TOMOGRAPH

[75] Inventor: Wolfgang H. Müller, Karlsruhe, Germany

[73] Assignee: Bruker Analytische Messtechnik GmbH, Germany

[21] Appl. No.: 215,889

[22] Filed: Mar. 21, 1994

Related U.S. Application Data

[63] Continuation of Ser. No. 856,068, May 6, 1992, abandoned.

[30] Foreign Application Priority Data

Nov. 8, 1989 [DE] Germany ............... 39 37 148.4

[51] Int. Cl.6 .................................. G01R 33/20
[52] U.S. Cl. .............................. 324/318; 324/322
[58] Field of Search .................. 324/322, 318, 300; 335/282; 128/653.5

[56] References Cited

U.S. PATENT DOCUMENTS

| | | | |
|---|---|---|---|
| 4,644,282 | 2/1987 | Kestler | 324/322 |
| 4,680,547 | 7/1987 | Leue et al. | 324/309 |
| 4,798,338 | 12/1988 | Roemer | 324/318 |
| 4,870,363 | 9/1989 | Yassine et al. | 324/318 |
| 4,959,613 | 9/1990 | Yamamoto et al. | 324/318 |
| 4,961,054 | 10/1990 | Park et al. | 324/322 |
| 5,017,871 | 5/1991 | Mueller et al. | 324/318 |
| 5,311,135 | 5/1994 | Vavrek et al. | 324/318 |

FOREIGN PATENT DOCUMENTS

| | | | |
|---|---|---|---|
| 0073399 | 3/1983 | European Pat. Off. | H01F 7/20 |
| 0250718 | 1/1988 | European Pat. Off. | H02M 5/458 |
| 0317775 | 5/1989 | European Pat. Off. | G01N 24/04 |
| 3907141 | 9/1989 | Germany | G01N 24/08 |
| 61-260150 | 11/1986 | Japan | G01N 24/06 |
| 1-110354 | 4/1989 | Japan | G01N 24/06 |

OTHER PUBLICATIONS

J. Phys. E: Sci. Instrum., vol. 14, 1981, pp. 1081–1087, Prinited in Great Britain: Bottomley: A versatile magnetic field gradient control system for NMR imaging.
Journal of Physics E: Scientific Instruments, vol. 21, No. 6, Jun. 1988, IOP Publishing Ltd., (Bristol, GB) R. Pouladian-Kari et al.: A multiple coil solenoid to provide an axial magnetic field with near-linear gradient, pp. 557–559.

*Primary Examiner*—Kenneth A. Wieder
*Assistant Examiner*—Raymond Y. Mah
*Attorney, Agent, or Firm*—Walter A. Hackler

[57] ABSTRACT

A system for the generation of magnetic gradient fields which intermittently overlap the static magnetic field of a nuclear-spin tomograph, with at least one pair of gradient coils, powered from a power supply, through which current flows in series when in operation and which generate, in a predefined volume under examination, a gradient magnetic field that varies at least approximately in linear fashion with position in one direction, is characterized in that each gradient coil (A, B) has one set with at least one first winding zone (S1) and one set with at least one second winding zone (S2), which have terminals (16, 17; 18, 19) that are separate from one another, in such a way that the winding zones can be easily be connected to and separated from one another in varying ways. The user can thereby modify the properties of the gradient system.

19 Claims, 13 Drawing Sheets

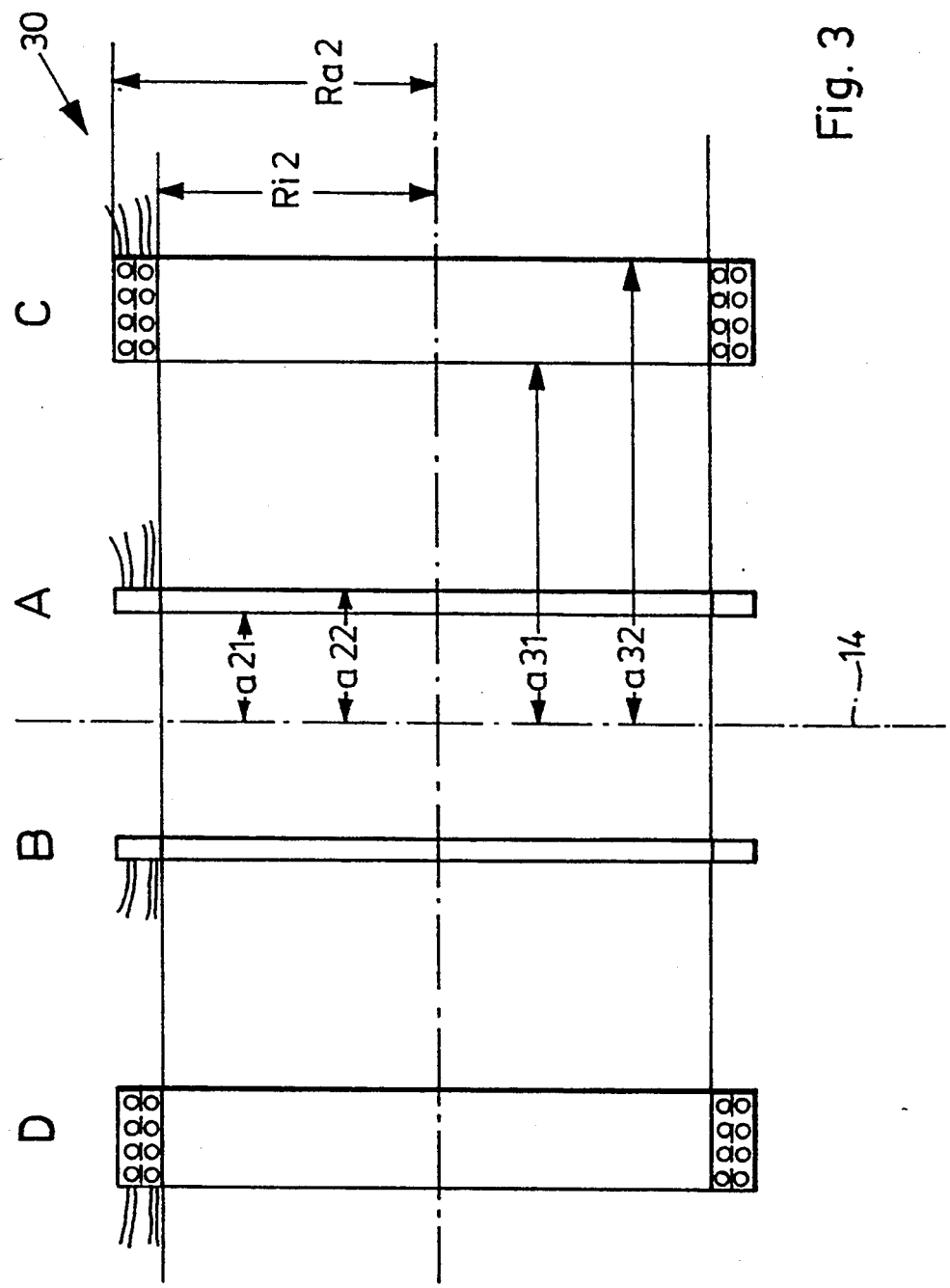

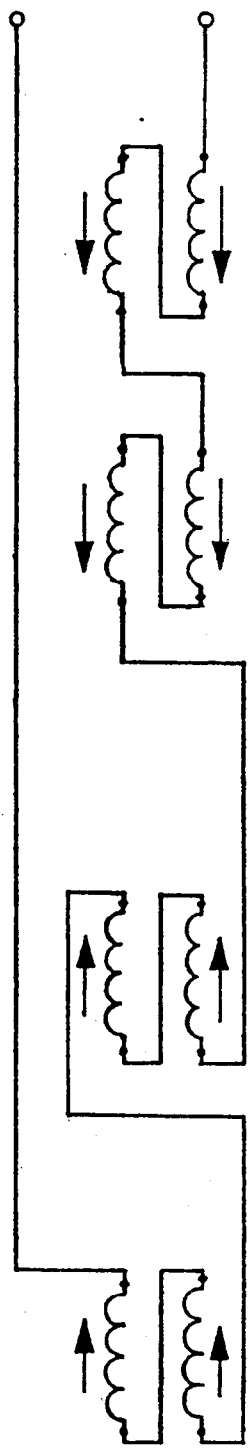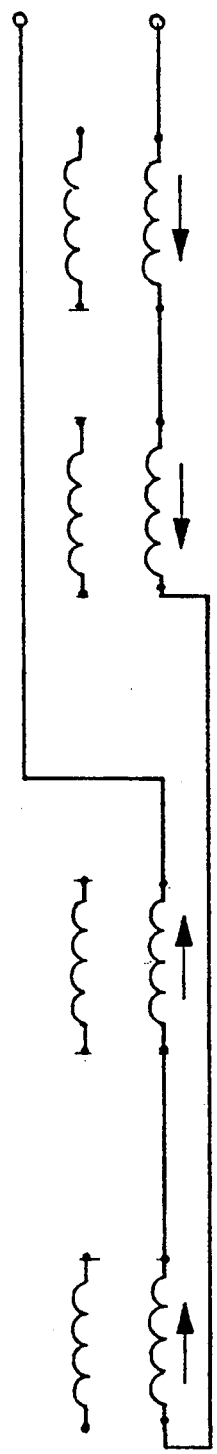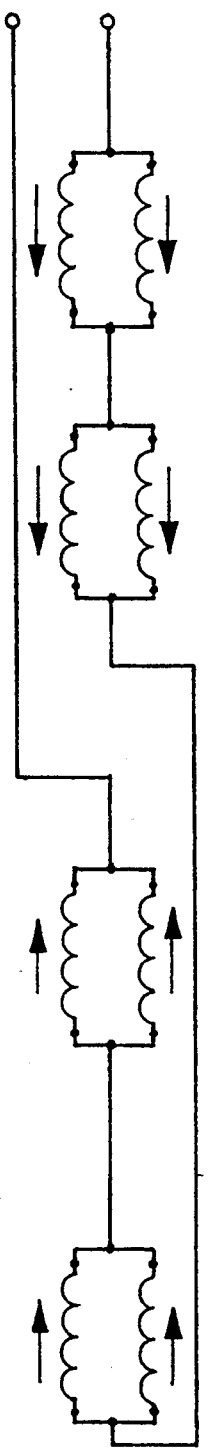

GRADIENT-GENERATION SYSTEM, NUCLEAR SPIN TOMOGRAPH, AND PROCESS FOR THE GENERATION OF IMAGES WITH A NUCLEAR-SPIN TOMOGRAPH

This is a continuation of application Ser. No. 07/856,068 filed on May 6, 1992, now abandoned.

BACKGROUND OF THE INVENTION

The invention concerns a system for the generation of magnetic gradient fields which intermittently overlap the static magnetic field of a nuclear-spin tomograph, with at least one pair of gradient coils, powered from a power supply, through which current flows in series when in operation and which generate, in a predefined volume under examination, a gradient magnetic field that varies at least approximately in linear fashion with position in one direction, with each gradient coil having one set with at least one first winding zone and one set with at least one second winding zone, that have terminals separate from one another. In a system of this kind known from DE-A1-39 07 141, in order to reduce the electrical load on semiconductor elements, each winding zone is connected to a separate unit driver to deliver the current necessary for gradient generation. The, for example, two winding zones of a gradient coil can be operated in such a way that currents flow through them in the same direction with each gradient coil having one set with at least one first winding zone and one set with at least one second winding zone, that have terminals separate from one another. In a system of this kind known from DE-A1 39 07 141, in order to reduce the electrical load on semiconductor elements, each winding zone is connected to a separate unit driver to deliver the current necessary for gradient generation. Thus, for example, two winding zones of a gradient coil can be operated in such a way that currents flow through them in the same direction, or so that a current flows through only a single winding zone.

The invention also concerns a nuclear-spin tomograph with a gradient-generation system of this kind, and a process for the generation of images with a nuclear-spin tomograph of this kind.

Nuclear-spin tomographs, their operation, and possible imaging processes are exhaustively described in the technical literature (e.g. "Medizinische Physik," 1983, Hüthig-Verlag, J. Schütz, ed.). In addition to a static magnetic field $B_o$ that is as homogeneous as possible, magnetic field gradients are also applied intermittently to an object being examined. A gradient field is a magnetic field which has the same direction as Bo, but whose strength varies linearly with position in one direction, and is constant perpendicular thereto. In general, a total of three different gradient fields are used, generated by a gradient-generation system with a plurality of gradient coils, with the directions of the corresponding gradients being perpendicular to one another ($Gz=dBz/dz$; $Gx=dBz/dx$; $Gy=dBz/dy$), where the z direction coincides with the direction of $B_o$.

The linear change in field strength (constant gradient profile) should exist, if possible, throughout the object being examined. This places certain demands on the gradient coils with which the gradient fields are generally generated. Such coils are depicted and described, for example, in the article by J. Heinzerling on page 59 of the aforesaid work. In tomographs with a solenoid-type main field coil (for $B_o$), the Gz gradient is usually generated with a so-called "anti-Helmholtz" arrangement, and the Gx and Gy gradients are generated with arrangements having four saddle coils each. Gradient coil sets adapted to the particular geometry are known for other magnet types, for example the "H magnet" (cf. DE 36 16 078), the "window frame" (cf. EP 181 383), or the type described in EP 167 639. Most of these coil arrangements are well known in high-resolution NMR, where such coils have been used for some time as static field-correction coils, or "shim coils."

When cylindrical coils are used as the gradient coils, in the simplest case only two coils—constituting the pair mentioned earlier—are needed in order to generate the gradient. As just mentioned, when saddle coils are used, four saddle coils are required for one gradient, each two of which constitute a single coil of the pair in the phraseology of the invention, so that the four saddle coils thus constitute the said pair.

Depending on the configuration of the gradient coils, the true gradient profiles correspond to the desired (constant) gradient profile over only a limited spatial region, which is often smaller than the object under investigation. Efforts have therefore been made to enlarge this region. This must naturally occur within certain existing constraints. With a solenoid-type main coil, the windings of the gradient coils are restricted to a cylindrical enveloping surface. Proposed solutions that essentially adopt the features known for shim coil sets are described, for example, in European patents EP-B-73399 and 73402. These solutions, which are capable of bringing higher orders of a gradient field development to zero, require either more coils or more turns than the single-coil solution. In addition, although in most cases the gradient field achieved with the use of higher-order coils is more homogeneous, it is also smaller than with single coils, assuming that the same energizing current is used in each case.

Most imaging processes in nuclear-spin tomography work with high-frequency pulse sequences, with the gradient fields also being switched on and off in a pulsed manner. The switching processes must therefore be as short as possible, but still defined and reproducible. The ideal case is a rectangular time profile or at least an approximately trapezoidal profile with the steepest possible edge (in the millisecond range). For a given inductance of the coil arrangement, a steeper leading edge requires a more powerful gradient power supplier to supply current to the gradient coils. It is therefore desirable to keep the inductance as low as possible, which is inconsistent with the requirement for a larger linearity region.

Pulsed gradient fields with rise times in the vicinity of a millisecond induce eddy currents in the surrounding conductive structure, which in turn lead to field distortions in time and space. One possible way of counteracting this problem is to use "self-shielding" gradient-generation systems, in which the gradient coils are surrounded externally by similar coils through which a current is sent in the opposite direction. This arrangement is configured so that the total magnetic fields largely compensate for one another on the outside, while a gradient field (which is as constant as possible) remains on the inside. Since more coils are available, both gradient generation and the shielding function can be optimized. Disadvantages include a considerably reduced gradient strength for the same energizing current. Self-shielding gradient-generation systems are described, for example, in EP-A-231 879, U.S. Pat. No. 4 733 189, and DE-A-3 808 995.

Since the known gradient-generation systems must satisfy contradictory requirements (maximum gradient strength, large homogeneity and linearity region, short rise times, no eddy current induction, etc.), it is fundamentally impossible to optimize them in every important respect. Known nuclear-spin tomographs have a single gradient-generation system (which comprises the aforesaid three gradient directions) that is either designed so that it represents a compromise for as many criteria as possible (universal system), or is optimized for an operator's particular needs. If those needs should change, they can be accommodated only by replacing the gradient-generation system. In particular, it is not possible to change the characteristics of the gradient-generation system during a single measurement (recording of a tomography image) or during a single measurement series.

Although EP-A-156 442 mentions operating a kind of combination shim and gradient-generation system in such a way that "the desired magnetic field profile in space and time" is achieved, this is to be understood to mean that a plurality of complex coil systems are activated by means of independent power supplies. The desired profile in space and time often requires currents that the power supplies cannot deliver, or tolerances that cannot be maintained. In addition, the configuration is very complex and expensive.

SUMMARY OF THE INVENTION

The object of the invention is to make available a relatively simple gradient-generation system that can easily be utilized by the user for at least two different operating modes.

The nuclear-spin tomograph according to the invention has a gradient-generation system in accordance with the invention, and the advantages relevant to the latter also apply to the nuclear-spin tomograph. The process for the generation of images according to the invention provides for the gradient-generation system to be switched in a controlled manner so that within a pulse sequence, the particular gradients that are optimum for the relevant time of the pulse sequence are effective.

The underlying idea of the invention is that there are several properties of a gradient-generation system which absolutely must be present for use in a nuclear-spin tomograph, but that these properties are never all required at the same time. There are imaging processes (or time periods within the process) that place very high demands on certain properties, while other properties are quite unimportant. In another process (or another time period), the groupings of important and unimportant properties may again be quite different. The invention recognizes that it is possible to design gradient-generation systems that, by simple electrical switching, optimize different groups of properties in each case, specifically those that are especially important in practice. The entire set of operating modes (preferably two) thus, as before, covers the entire range of possible applications.

For example, in embodiments of the invention the system can be designed to generate stronger gradients with single coils, making possible short rise times although the linearity region will necessarily be small. Nonetheless, the system is inherently entirely serviceable and sufficient for many applications. Activation of additional linearization coils will increase the inductance and thus the rise times, but will enlarge the linear region. Both switching states or operating modes represent useable gradient-generation systems.

In embodiments of the invention, it is even possible to switch between the two switching states during a measurement, in fact even within a pulse sequence. As an example, different requirements may be imposed in terms of, for example, slice gradient, phase gradient, and read gradient depending on position in the pulse sequence; for example the slice gradient does not need to have a particularly linear profile, or certain gradients must be switched more quickly than others. Thus it is also possible, depending on the instantaneous requirement—for example, depending on the direction of the selected slice—to operate the various gradients in the X, Y or Z directions in varying combinations of the switchable coil configurations.

With self-shielding gradient-generation systems, shielding can be completely dispensed with in certain imaging processes. Instead, the outer coils can be supplied with current in the same direction as the inner coils, so that the gradient fields are added together. This entails omitting the shielding and a portion of the linearity, but optimizes the gradient field strength. As in the previous case, it is important that both operating modes represent functional systems.

The invention thus makes it possible, with an amount of effort comparable to that for a well-linearized self-shielding system that would necessarily have slow switching characteristics, to implement two systems: one almost equally linear (self-shielding), and one fast and/or strong system. Switchover will occur on the basis of the prevailing requirement or sample size.

In some cases it will be possible to implement the two operating modes with the extremely linearized or self-shielding gradient-generation systems according to the prior art, although these known systems must be modified so that the currents in partial windings (which also include partial coils) can be modified for switchover purposes, in particular can be switched off or reversed in polarity.

Additional combinations and embodiments of the elements of the invention are possible. For example, a subsystem can be switched on or off, but the polarity of the current and/or the current intensity can also be modified. Accordingly, the subsystems can be operated by one power supply in series or independently of one another, thus creating a new degree of freedom for optimization. It is advantageous, however, if the subsystems are operated in series. Switchovers between more than two operating modes can be provided for.

In one embodiment of the invention, the first winding zones of the two gradient coils of the pair are permanently connected in series with one another, and the second winding zones of the two gradient coils of the pair are permanently connected in series with one another. As a result, no switchovers are required in the region between these coils.

Depending on how quickly the switchover between the various operating modes must occur, it may be necessary, as provided for in embodiments of the invention, to provide controllable electrical or electronic switches that can be remotely controlled manually or automatically, especially by control outputs of a pulse control unit for the gradient power supply. If, on the other hand, a great deal of time (for example, several minutes) is available for the switchover, it can also be done manually by means of plug-changing devices or by means of manually actuated switches. The invention is also intended to encompass embodiments in which the switchover between the operating modes requires resoldering of coil terminals of the gradient coils; these coil terminals must be arranged so as to be easily accessible to the user.

BRIEF DESCRIPTION OF THE DRAWINGS

Exemplary embodiments of the invention will now be described with reference to the drawings, which show details that are essential to the invention. The individual features can be implemented each individually by themselves or severally in any combination in an embodiment of the invention. In the drawings.

FIG. 3 shows a second exemplary embodiment of a coil arrangement with four double-layer individual coils to generate the Z gradient;

FIGS. 6a-c show examples of possible circuits for the coils of FIG. 5;

DETAILED DESCRIPTION

The description will be limited to a gradient-generation system for a solenoid-type main field magnet, and the exemplary embodiments that have concrete numerical indications describe only the configuration of the gradient-generation system that generates the Z gradient. The magnet type selected is by far the most common one, and the Z gradient is the most graphically descriptive, and the one that is easiest to comprehend theoretically.

Figure 1:
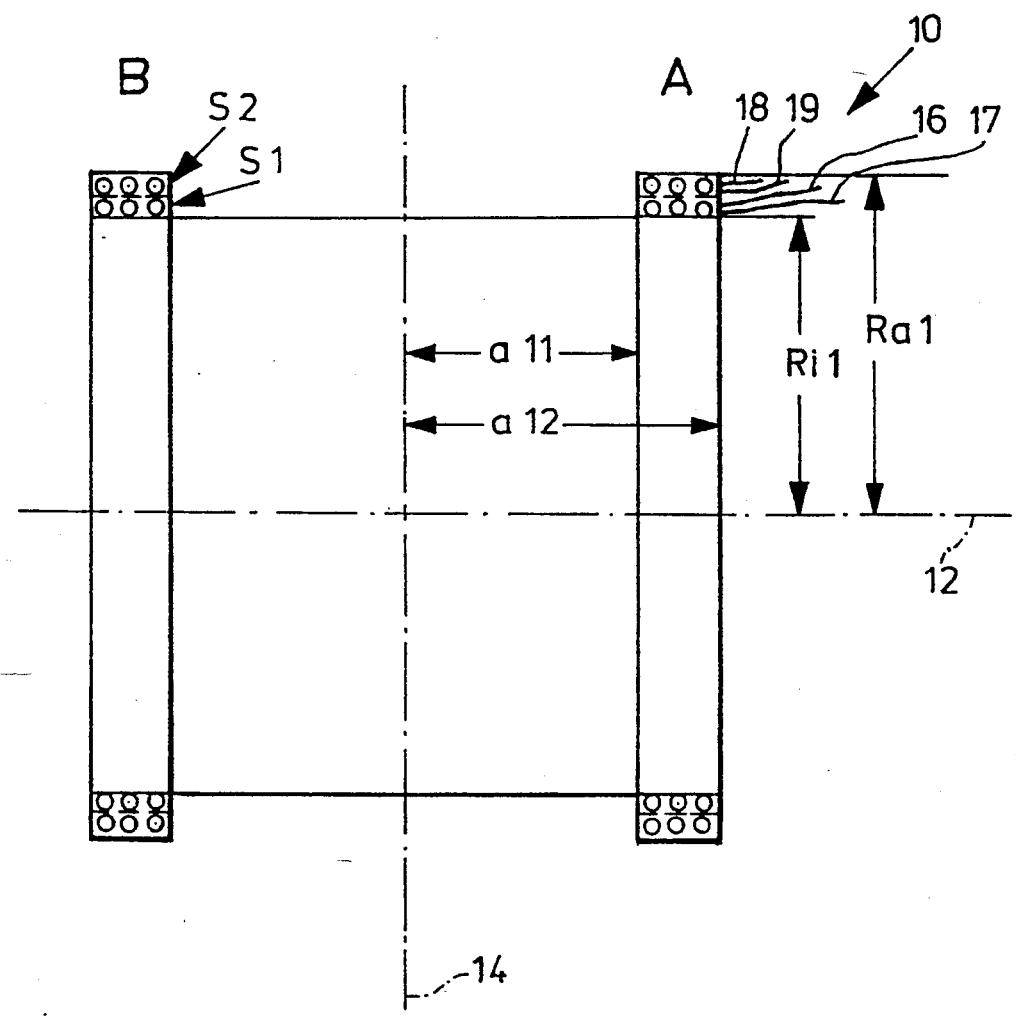
FIG. 1 shows a first exemplary embodiment with two double-layer coils in an anti-Helmholtz arrangement to generate the Z gradient.

FIG. 1 shows a coil arrangement 10 with two coils A and B of completely identical design, each of which has two separate winding zones or layers S1 and S2, each having the same number of turns. The annular coils A and B, with an essentially rectangular winding cross section, are arranged concentrically with respect to an axis 12 that is at the same time the axis of the field coil (not shown) which generates the constant field B0 for the nuclear-spin tomograph to which the coil arrangement 10 belongs. The coils A and B are symmetrical with respect to a transverse central plane 14, running orthogonally to the axis 12, of the magnet system of which the aforesaid field coil is an essential component.

In one concrete exemplary embodiment, the outside radius Ra1 of the two coils A and B is 80.8 mm, and the inside radius Ri1 is 76.4 mm. The spacing a11 of the two coils A, B from the transverse central plane 14 is 59.0 mm, and the spacing a12 is 79.8 mm. Consequently the inside clearance between the two coils is 118 mm, and their width is 20.8 mm. Each coil contains two layers of 13 turns each, for a total of 26 turns. The individual layers S1 and S2 of each coil are provided with their own electrical terminals 16, 17 for the respective inner layer S1 and 18, 19 for the respective outer layer S2, thus making it possible to connect these individual layers or winding zones to one another and to a power supply in any desired manner. All the winding zones of all the coils are wound in the same direction. This also applies to the subsequent exemplary embodiments.

FIG. 2 shows advantageous ways in which the individual partial windings of the coils can be connected to one another.

Figure 2A:
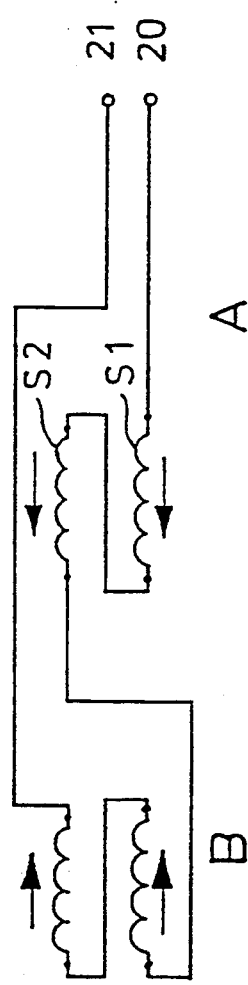
FIGS. 2a-c show examples of possible circuits for the coils of FIG. 1.

FIG. 2a shows a circuit in which all the winding zones of the two coils A and B are connected in series, and are connected to two terminals 20 and 21. When the terminal 20 is attached to the positive pole of a DC voltage, and the terminal 21 to the negative pole, current then flows through the winding zones in the direction indicated by the arrows in the Figure. Current flows through both winding zones of coil A in the same direction, and through both winding zones of coil B in the same direction but in a direction opposite to that of coil A. The two magnetic fields generated by coils A and B are therefore oriented opposite to one another; as is generally known, this results in a Z gradient in the direction of the axis 12, which is referred to in the usual manner as the Z axis of the magnet system. At the same time, the field B0 generated by the field coil prevails in the transverse central plane 14, and this field becomes greater or smaller in proximity to coils A and B, depending on the current direction and winding direction of these coils. It is understood that the same polarity does not always need to be present at the terminal 20 during a measurement. In FIG. 2a, the result is a relatively high total inductance and a strong gradient, but also a relatively long rise time when the current is suddenly switched on.

Figure 11:
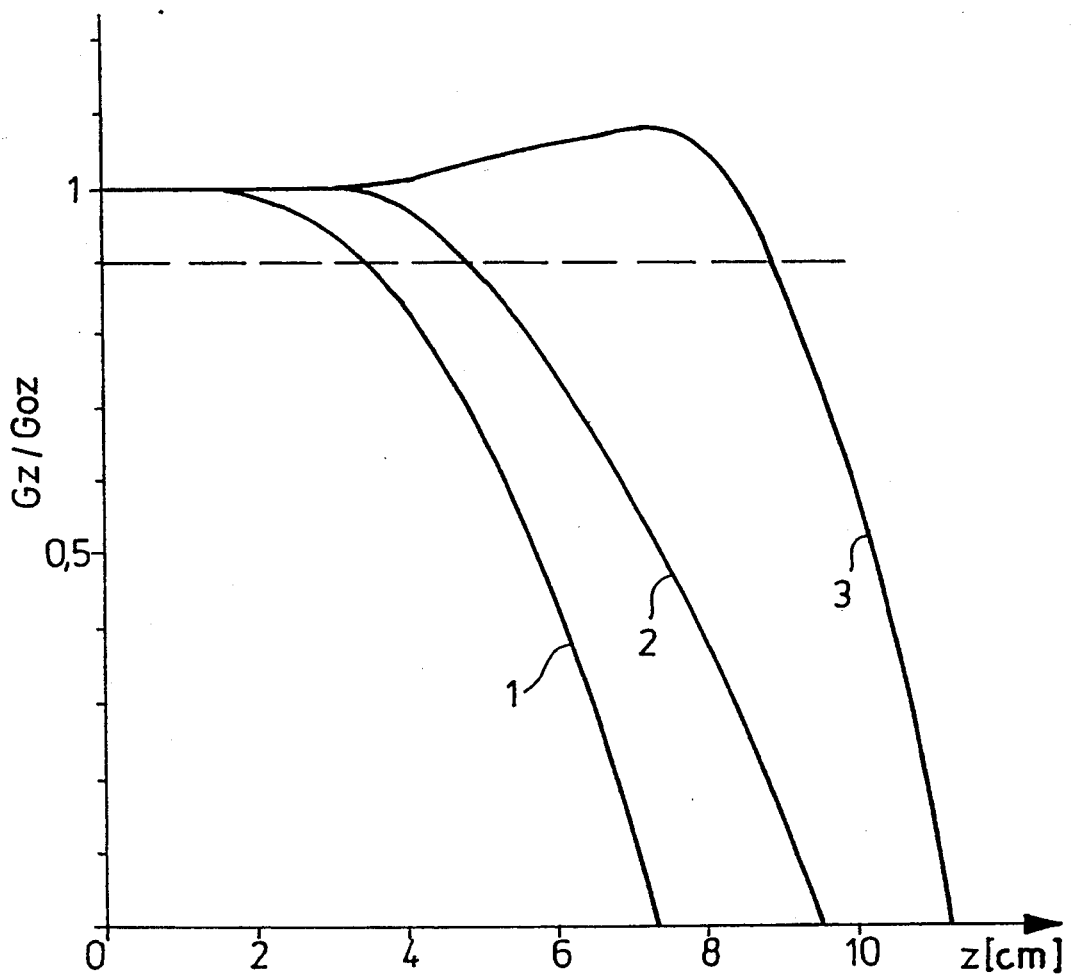
FIG. 11 shows the relative gradient strength for the same specific arrangements as in FIG. 10.

The linearity of the arrangement, which is defined at a deviation of 10% from the value in the transverse central plane 14, is in this case 3.5 cm in the Z direction, as is also evident from curve 1 in FIG. 11 which applies to this circuit.

Figure 2B:
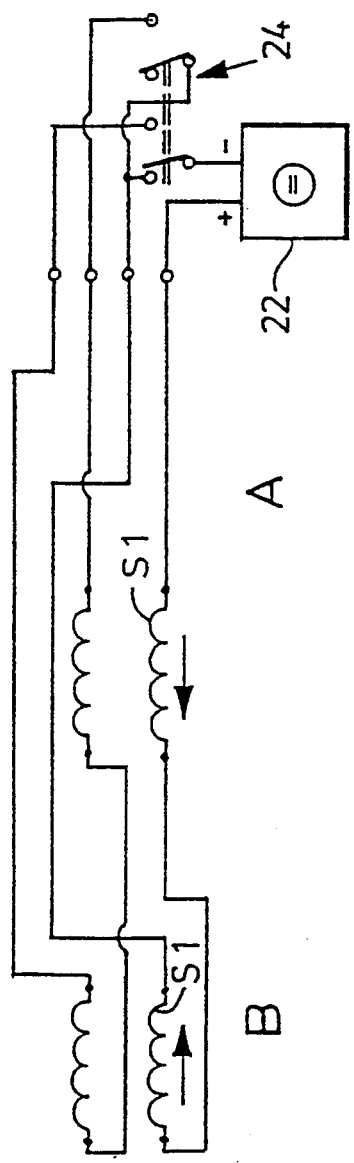

FIG. 2b shows a circuit arrangement using the coil arrangement 10, in which a power supply 22 and a multiple-pole changeover switch 24, that can occupy two switch positions I and II, are provided. In switch position I as shown, current flows through only one winding zone in each case, specifically the inner winding zone S1 of each coil A and B, in the same direction as shown in FIG. 2a. The result is an inductance reduced by a factor of 4 compared with FIG. 2a, and thus a weaker gradient and a rise time reduced by the same factor. With the switch 24 in position II, current flows through all the partial windings in exactly the same directions as in FIG. 2a.

Figure 2C:
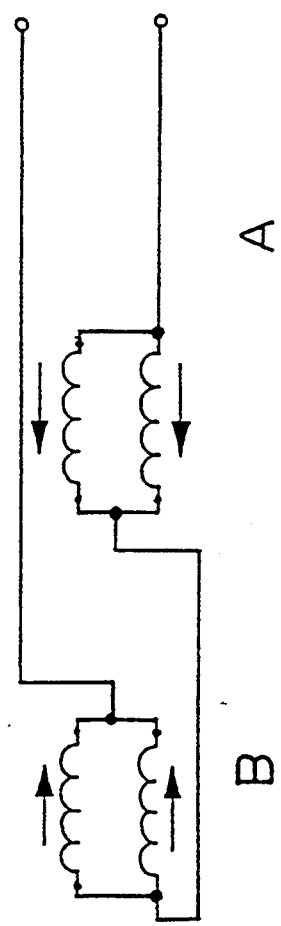

In FIG. 2c, the arrangement is such that the two partial windings of each coil A and B are connected in parallel with one another. The result is the same inductance as in FIG. 2b in position I, but a lower ohmic resistance in the windings.

The arrangement in FIG. 2b can be modified so that the connections among the winding zones shown in FIG. 2c can be achieved by actuating a switch. It is also possible, as it is with most of the exemplary embodiments described below, to implement the particular desired interconnection of the partial windings by means of other switching devices, for example with electrical plug devices, or to connect the terminals of the winding zones to one another as necessary in the desired manner by means of solder joints.

Table 1 shows some measurement data for the coil arrangement 10 in the circuit arrangements shown. IA is the current through one or both winding zones of coil A, and IB is the corresponding current in coil B. A current indication of −40 A represents the current direction shown for coil B in FIG. 2, which is opposite to the current direction in coil A. dBz/dz is the magnitude of the gradient, measured in mT/m. L is the total inductance of the arrangement, and R the total resistance. U(stat) is the static voltage present at the power supply when DC current is being delivered to the arrangement.

In this case as in all other cases, a power supply that can deliver a current of 40 A at a voltage of 40 V is used to provide power. In the tables, $\tau$ is the rise time needed to reach a current of 40 A at a voltage of 40 V. On the basis of the aforesaid concretely specified dimensions of the coil arrangement 10, this coil arrangement 10 constitutes a functional arrangement in all of the circuit modes shown in FIG. 2. At higher inductance (FIG. 2a) the gradient is high; at lower inductance the gradient is less (for the same current), but the rise time is also reduced. Linearity is approximately equal in the two cases.

In the second example shown in FIG. 3, a coil arrangement 30 has a total of four coils A to D. The outside radii Ra2 and inside radii Ri2 are the same size in the example, and in a specific exemplary embodiment are precisely identical to the dimensions indicated for FIG. 1. Coils B and D are arranged symmetrically to coils A and C with respect to the transverse central plane 14. All the coils are once again annular and arranged coaxially with respect to the axis 12. The spacings of coil A from the transverse central plane 14 are a21=38.4 mm and a22=43.2 mm, and the corresponding spacings of coil C from the transverse central plane 14 are a31=97.9 mm and a32=133.1 mm. This results in a width for coils A and B of 4.8 mm, and for coils C and D of 35.2 mm. Coils A and B each have two layers with three turns each, or a total of 6 turns. Coils C and D each have two layers with 22 turns, or 44 turns each. To simplify the drawing, not all the layers are shown. The terminals of each individual layer on each coil are once again implemented individually, and can thus be connected to one another in different ways.

Figure 4A:
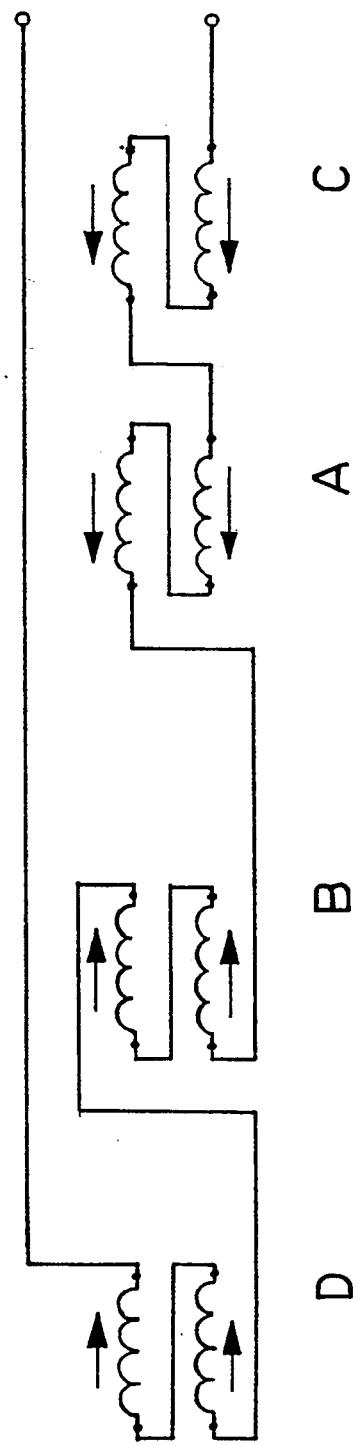
FIGS. 4a and b show examples of possible circuits for the coils of FIG. 3.

FIG. 4 shows a total of two circuits that have proven to be especially advantageous with the arrangement according to FIG. 3. In FIG. 4a, the layers of each individual coil are connected in series so as to yield the maximum inductance for the individual coil, and current flows through coils A and C in the same direction; while current also flows in the same direction through coils B and D, but in the opposite direction from coils C and A.

Figure 4B:
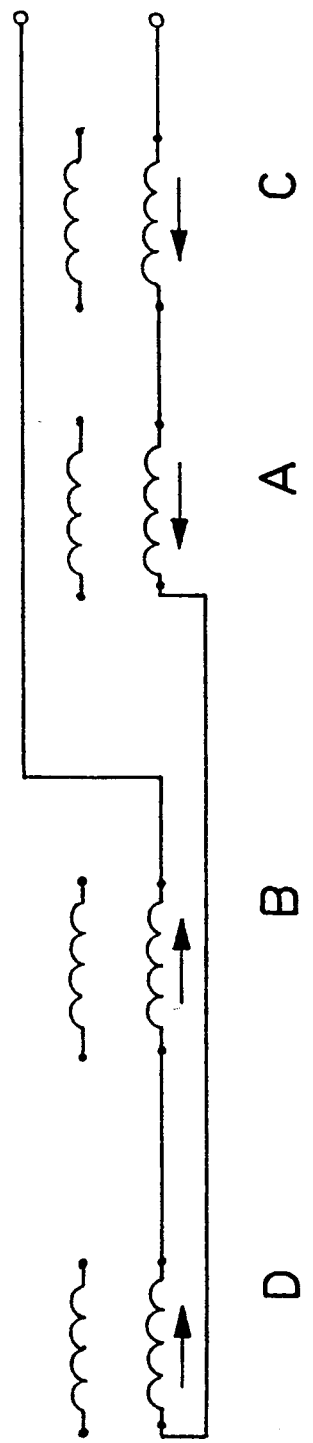

In FIG. 4b, current flows only through the respective inner layers of all the coils, in the same direction as in FIG. 4a.

TABLE 1

| | | IA | IB | dBz/dz | L | R | U (stat) | $\tau$ |
|---|---|---|---|---|---|---|---|---|
| a) | coil A + B 2 layers, in series | +40A | −40A | 13.3 mT/m | 350 $\mu$H | 0.17Ω | 6.8 V | 350 $\mu$s |
| b) | coil A + B 1 layer, in series, I (II as a)) | +40A | −40A | 6.6 mT/m | 87.5 $\mu$H | 0.085Ω | 3.4 V | 88 $\mu$s |
| c) | coil A + B 2 layers, parallel | 40A | −40A | 6.6 mT/m | 87.5 $\mu$H | 0.042Ω | 1.7 V | 88 $\mu$s |

A further circuit possibility arises if the numbers of turns in layers 1 and 2 are different. For example, if instead of 13 turns only 6 turns are selected for layer 2, an inductance of only 18.6 $\mu$H can be reached with this partial coil alone. At an operating current of 40 A and a voltage of 40 V, the result is a gradient strength of 3.0 mT/m at a rise time of 18.6 $\mu$s. If only layer 1 is used, the values shown in Table 1.b) are achieved. When layers 1 and 2 are connected in series, the values in Table 1.a) change, since layer 2 has fewer turns. With a total number of windings equaling 19, the result is a gradient strength of 9.7 mT/m and a rise time of 197 $\mu$s, once again assuming an operating current of 40 A and a voltage of 40 V. Thus three different operating modes, The arrangement according to FIG. 3 shows a better linearity of the magnetic field in the Z direction as compared with FIG. 1. In order to achieve the same gradient strength at the same operating current, however, a considerably higher number of ampere-turns—and thus a considerably higher inductance—must be accepted. This increases the rise time to a value of 925 $\mu$s. With a circuit arrangement according to FIG. 4b, a short rise time of only 230 $\mu$s can be achieved. The same rise time with reduced resistance R would be attained if the two layers of each coil were connected in parallel, as was done in FIG. 2c.

Table 2 shows the measurement readings for the two circuits in FIG. 4.

TABLE 2

| | | IA | IB | IC | ID | dBz/dz | L | R | U (stat) | $\tau$ |
|---|---|---|---|---|---|---|---|---|---|---|
| a) | coils A,B,C,D | 40A | −40A | 40A | −40A | 13.3 mT/m | 925 $\mu$H | 0.32Ω | 12.8 V | 925 $\mu$s |

TABLE 2-continued

|   |   | IA | IB | IC | ID | dBz/dz | L | R | U (stat) | τ |
|---|---|---|---|---|---|---|---|---|---|---|
| b) | 2 layers, in series coils A,B,C,D 1 layer, in series, | 40A | −40A | 40A | −40A | 6.7 mT/m | 230 μH | 0.16Ω | 6.4 V | 230 μs |

Figure 5:
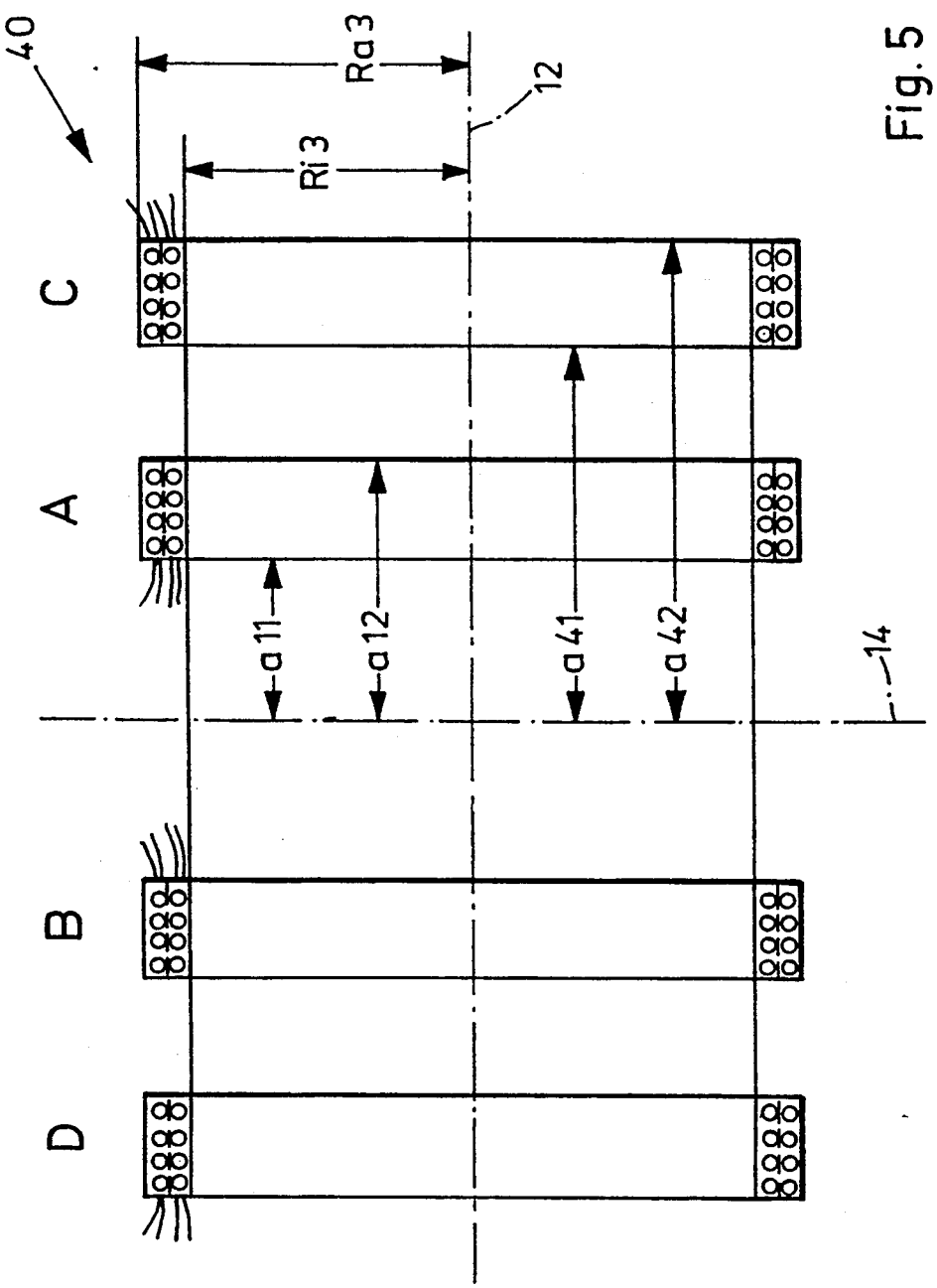
FIG. 5 shows a third exemplary embodiment with four double-layer coils to generate the Z gradient.

The coil arrangement shown in FIG. 5 has a total of four coils A, B, C, and D, in which, in the exemplary embodiment, the outside radii Ra3 and the inside radii Ri3 are the same throughout. The two coils A and B located closest to the transverse central plane 14 are entirely identical to coils A and B of FIG. 1. If coils C and D are completely switched off, the arrangement shown in FIG. 5 can therefore be operated exactly like the arrangement of FIG. 1. Coils A and C on the one hand and B and D on the other hand can each be regarded as partial coils of a total coil AC and BD respectively.

The outside radius Ra3 and the inside radius Ri3 of the outer coils C and D are identical to the corresponding dimensions of the inner coils A and B, and are thus 80.8 mm and 76.4 mm, respectively.

As indicated above, coils A and B each have 26 turns, while coils C and D (also double-layer) have 2×12 turns, and thus a total of 24 turns each.

The shortest switching time is obtained with the arrangement of FIG. 4 if the circuit corresponding to FIG. 2b is used, and thus if only one layer each of coils A and B is used. The greatest gradient strength with improved linearity results from the circuit according to FIG. 6a. In this case all four coils A through D are connected, in double-layer mode, in series; the result, along with a higher gradient strength of approximately 18 mT/m, is improved linearity as compared to the arrangements in FIGS. 1 and 3 with an extension of approximately 5 cm, if the linearity limit is located at 10% deviation (cf. FIG. 11, curve 2). The arrangement according to FIG. 5 can also be operated in single-layer mode, as shown in FIG. 6b. This produces a gradient strength of 9 mT/m and a rise time of 200 μs. Identical values with reduced resistance are achieved with the circuit according to FIG. 6c.

This example shows especially clearly the advantage of the invention, namely that by simple switching or changing of terminals, with no change to the configuration of the apparatus, it is possible to institute a range of gradient strengths, rise times, and linearity volumes to suit the experimenter's needs.

Table 3 shows quantitative data for the circuits of FIG. 6.

TABLE 3

|   |   | IA | IB | IC | ID | dBz/dz | R | U (stat) | τ |
|---|---|---|---|---|---|---|---|---|---|
| a) | coils A,B,C,D 2 layers, in series | 40A | −40A | 40A | −40A | 17.7 mT/m | 0.32Ω | 12.7 V | 820 μs |
| b) | coils A,B,C,D 1 layer, in series, | 40A | −40A | 40A | −40A | 8.9 mT/m | 0.16Ω | 6.4 V | 200 μs |
| c) | coils A,B,C,D 2 layers, parallel | 40A | −40A | 40A | −40A | 8.9 mT/m | 0.08Ω | 3.2 V | 200 μs |

Figure 7:
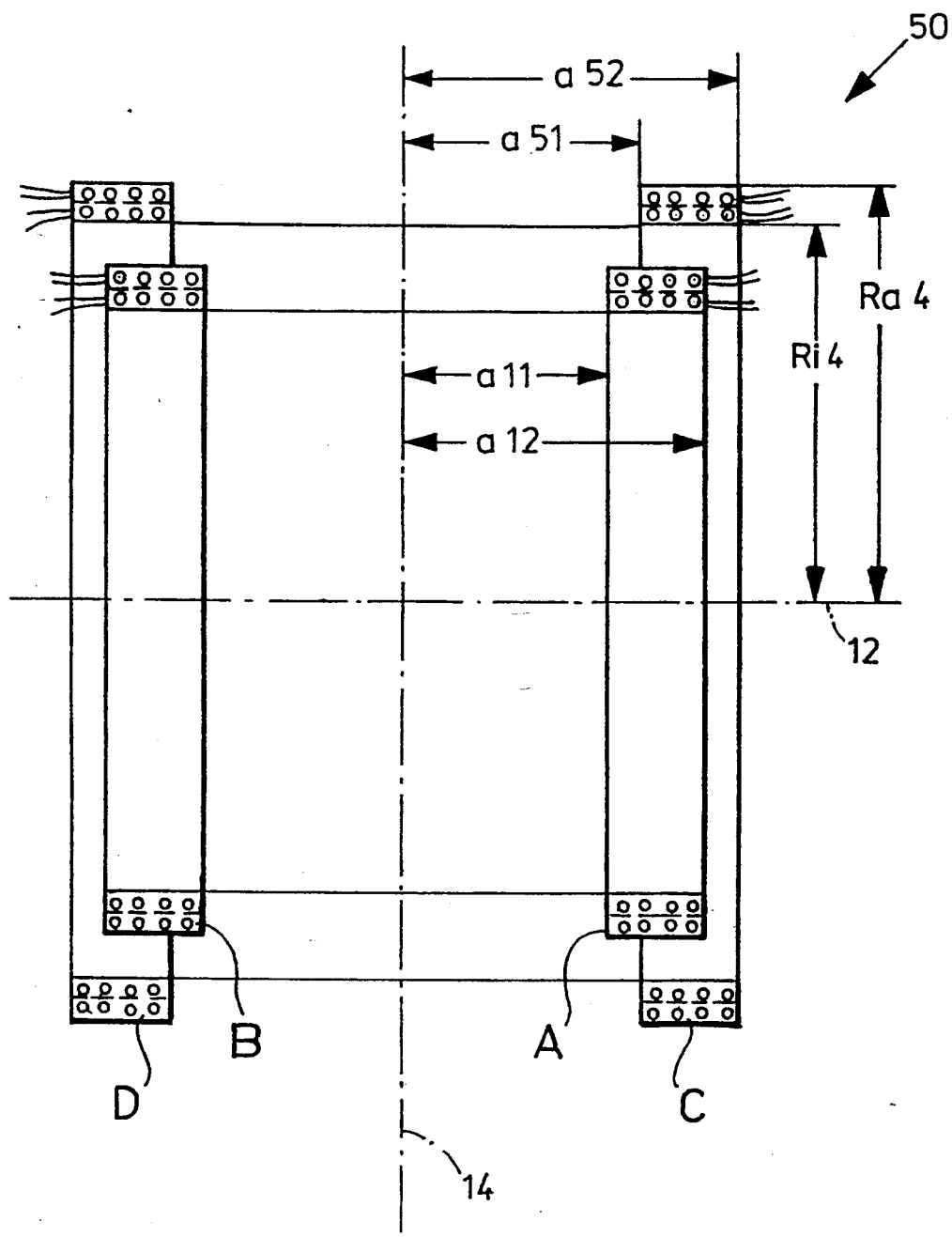
FIG. 7 shows a fourth exemplary embodiment with a coil system consisting of double-layer coils, which allows active shielding, to generate the Z gradient.

The exemplary embodiment of a coil arrangement 50 shown in FIG. 7, with four coils A to D, once again contains the same coil arrangement A, B as depicted in FIG. 1. FIG. 7 shows the implementation of the invention in an actively shielded system. Coils C and D are arranged essentially radially outside coils A and B, and partly overlap them in the axial direction.

In the specific exemplary embodiment, coils C and D, which once again are arranged symmetrically with respect to the transverse central plane 14, have an outside radius Ra4 of 108.3 mm and an inside radius Ri4 of 103.9 mm. The spacing a51 from the transverse central plane is 59 mm, and the spacing a52 from the transverse central plane 14 is 91 mm, corresponding to a width for coils C and D of 32 mm in each case.

Coils A and B are again each double-layer, with 2×13 or a total of 26 turns, and coils C and D each have two layers with 5 turns each, or 10 turns each. Here again, as in all the other examples, the terminals of the individual turns or general winding zones are led out separately, so that the coils and winding zones can be connected in any desired manner.

The number of ampere-turns on the outer shield formed by coils C and D is dimensioned so as to produce an optimal shielding effect outside the gradient volume, as is known in the prior art.

Figure 8A:
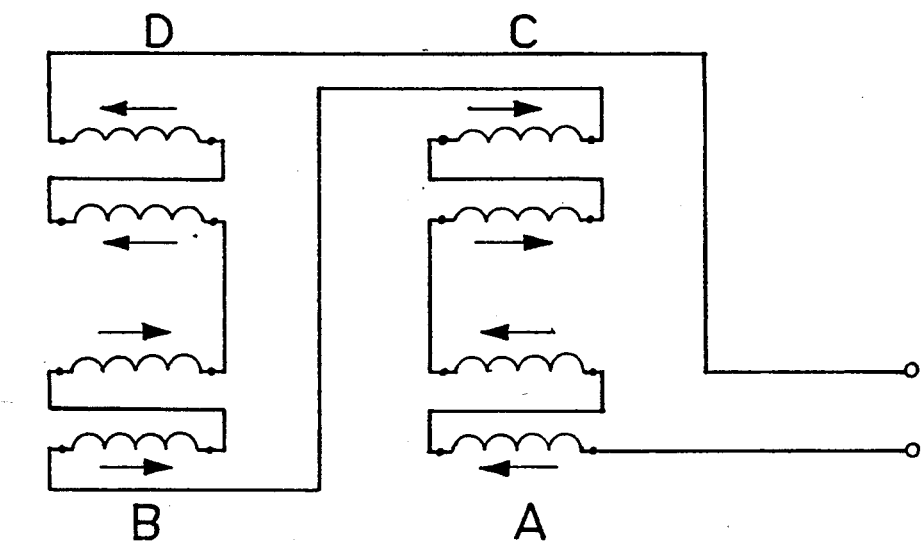
FIGS. 8a-c show examples of possible circuits for the coils of FIG. 7.
Figure 8B:
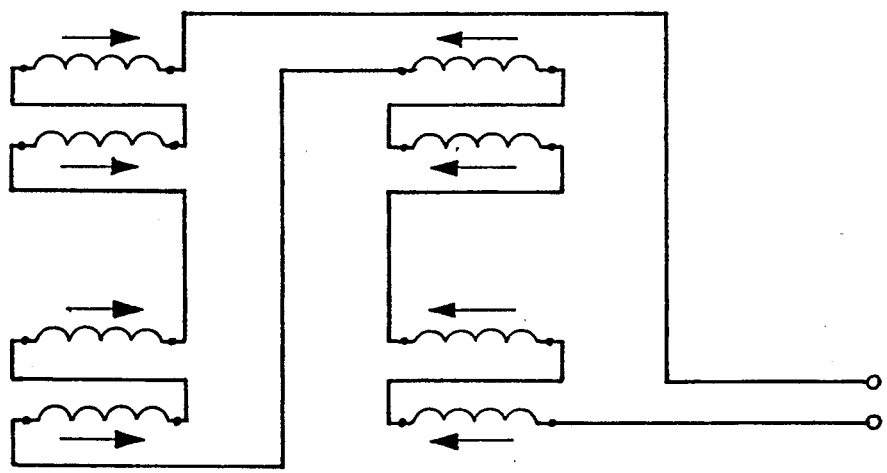
Figure 8C:
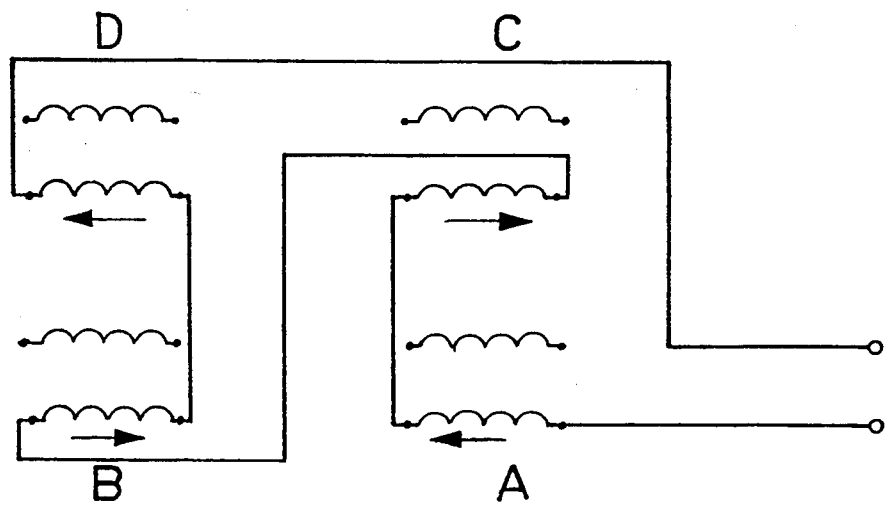

FIG. 8 shows three preferred methods of operating the arrangement 50 of FIG. 7. In the circuit according to FIG. 8a, the coils A and B are drawn at the bottom, and coils C and D at the top. All the layers of all the coils are connected in series, with the inner coils A and B being operated as also shown in FIG. 2a, and the outer coils C and D operating as shielding. This operating mode results in somewhat lower gradient strengths and inductances as compared with the case of FIG. 2a, and thus in somewhat shorter rise times. If, as in other examples described earlier, only one layer each of coils A and B and only one layer of coils C and D are used, with the latter coils again acting as shielding (cf. FIG. 8c), the result, with the same shielding effect, is half the gradient strength and a reduction in rise time by a factor of four. The greatest gradient strength is achieved by connecting all the layers of all the coils A to D in series, so that the magnetic fields of coils A to D are added together, as shown in FIG. 8b. With this circuit the system is not shielded from the outside.

Table 4 shows quantitative data for the three circuits of FIG. 8.

TABLE 4

|   |   | IA | IB | IC | ID | dBz/dz | L | R | U (stat) | τ |
|---|---|---|---|---|---|---|---|---|---|---|
| a) | coils A,B,C,D 2 layers, screened | 40A | −40A | −40A | +40A | 9.9 mT/m | 280 μH | 0.25Ω | 10 V | 280 μs |
| b) | coils A,B,C,D 2 layers, | 40A | −40A | 40A | −40A | 16.8 mT/m | 550 μH | 0.25Ω | 10 V | 550 μs |
| c) | coils A,B,C,D 1 layer, screened | 40A | −40A | −40A | +40A | 5.0 mT/m | 70 μH | 0.125Ω | 5 V | 70 μs |

Figure 9:
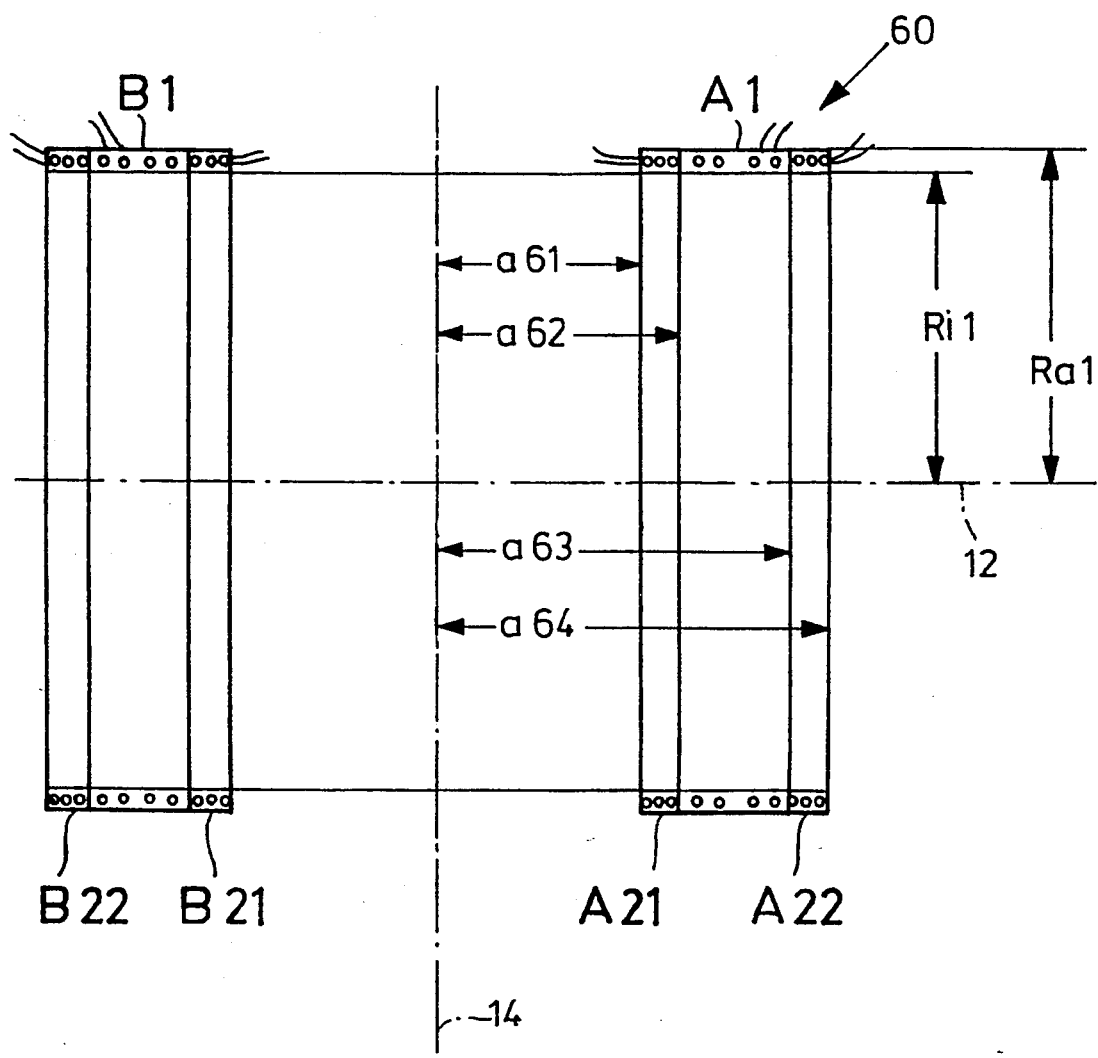
FIG. 9 shows a fifth exemplary embodiment with a coil system with partial coils.

In the arrangement shown in FIG. 9, instead of separate layers of windings arranged one behind the other in the axial direction, partial coils that are separate from one another and can be connected to one another in the particular manner desired, are provided. All the partial coils have the same inside radius Ri1 and the same outside radius Ra1. In the example, a single-layer coil A1 and a coil B1 of the same design are arranged symmetrically with respect to the transverse central plane 14. Arranged in direct contact with the said coils A1 and B1 towards the transverse central plane 14 are a coil A21 and B21, respectively, and arranged on the side of coils A1 and B1 facing away from the transverse central plane 14 are coils A22 and B22, respectively. Six partial coils are therefore present, the winding terminals of each of which are guided to the outside.

In the example, the partial coils A21 and A22 are always operated connected in series, and can therefore be construed as a single partial coil A2. The same is correspondingly true for the partial coils B21 and B22. In a specific exemplary embodiment, the arrangement according to FIG. 9 has the following dimensions: Ri1=76.4 mm; Ra1=78.6 mm; a61=54.2 mm; a62=59.0 mm; a63=79.8 mm; a64=84.6 mm.

Coils A1 and B1 each have 13 turns; partial coils A21, A22, B21, and B22 each have three turns.

If the number of turns selected for partial coils A21 and A22 on the one hand and B21 and B22 on the other hand are different, it is evident that this increases the number of gradient strengths that can be generated, as compared with the example of FIG. 9.

Figure 10:
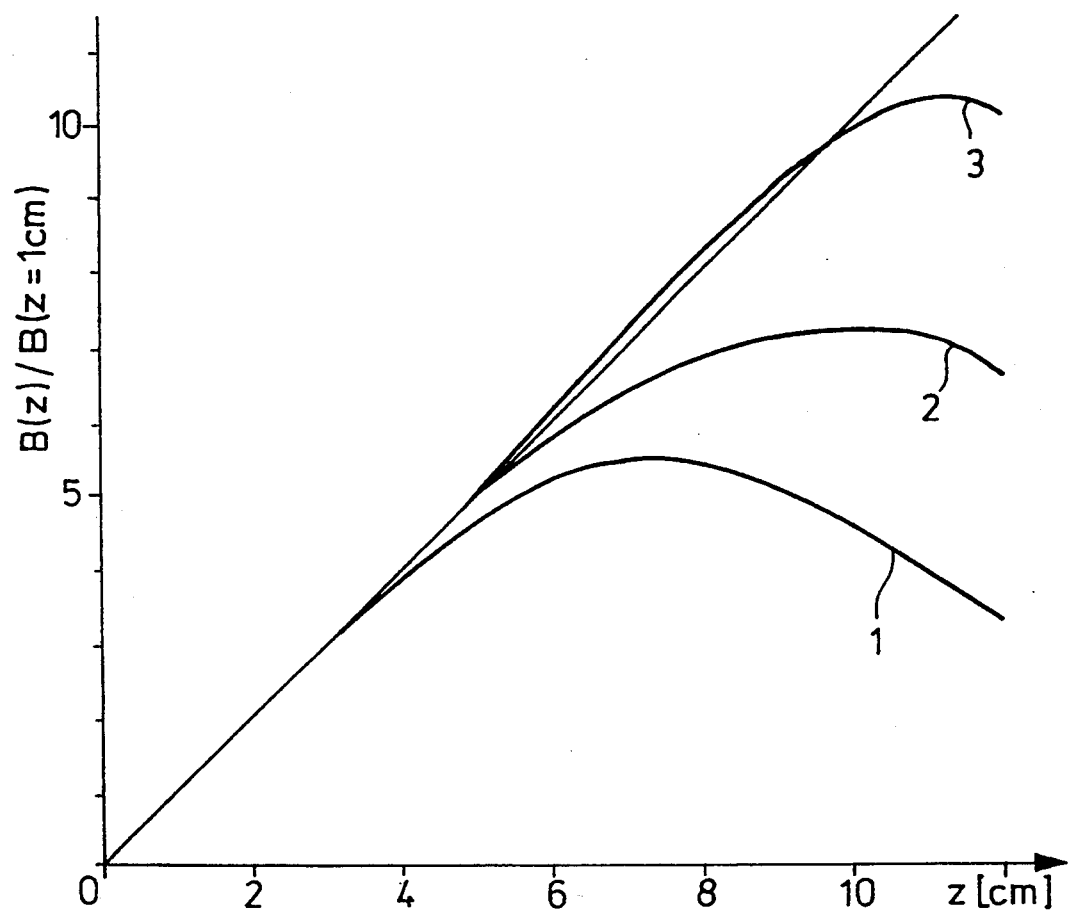
FIG. 10 shows standardized field profiles for specific arrangements according to each of the first through third exemplary embodiments.

FIG. 10 shows the profile of the field strength at the axis 12, standardized for a spacing Z=1 cm, for a specific circuit arrangement of each of the coil arrangements shown in FIGS. 1, 3, and 5.

FIG. 11 correspondingly shows the relative gradient strengths for the same circuits as FIG. 10.

Each of the curves labeled with the number 1 in FIGS. 10 and 11 describes the behavior of the circuit according to FIG. 2a, with the values indicated for it in Table 1. The curves labeled 2 refer to the arrangement according to FIG. 5, and the circuit according to FIG. 6a with the respective values of Table 3. The curves labeled 3 refer to the coil arrangement of FIG. 3 with the circuit arrangement of FIG. 4a, with the associated values of Table 4.

Figure 12:
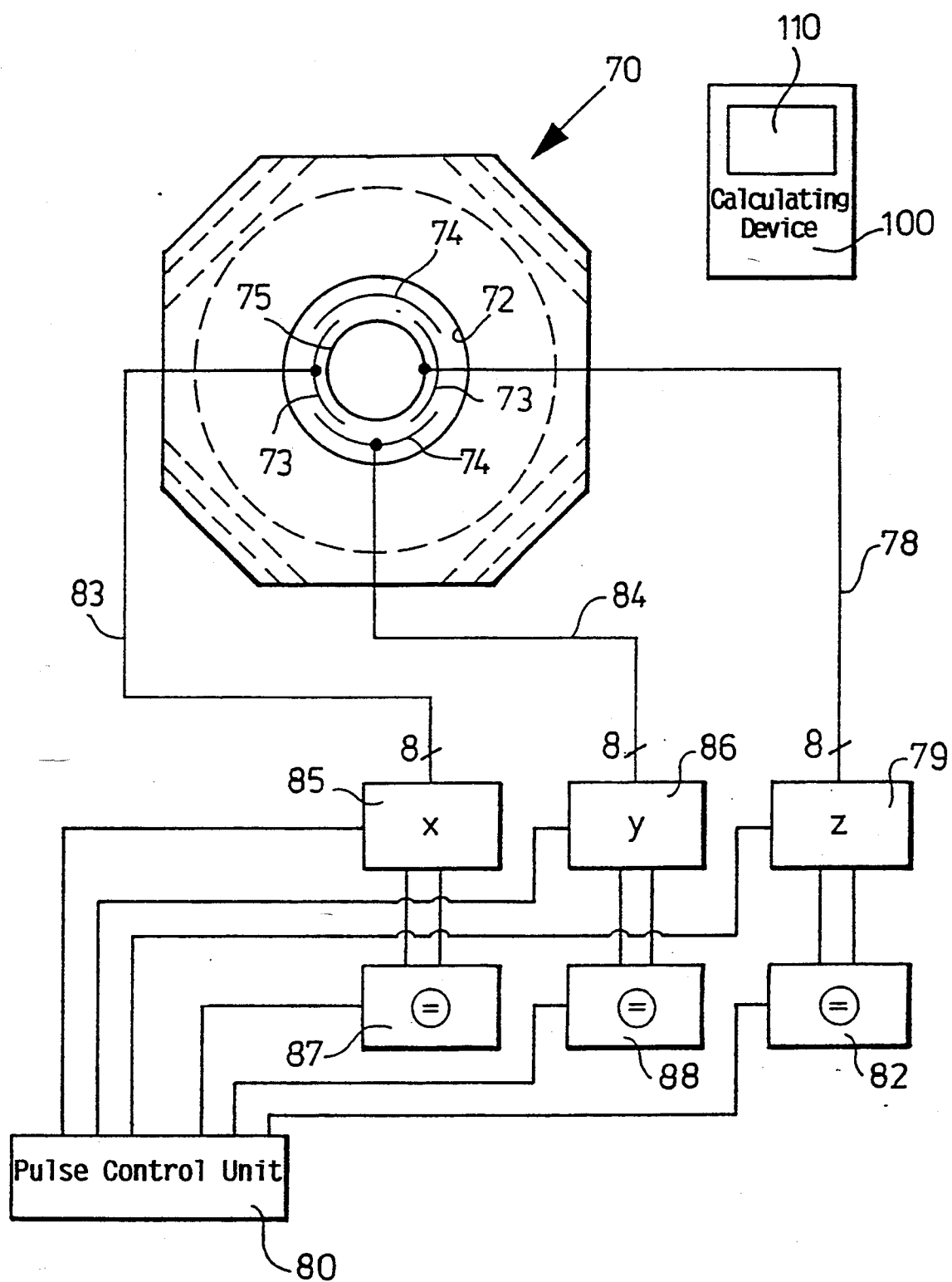
FIG. 12 schematically shows a nuclear-spin tomograph with a field coil and gradient coils for three gradients that are connected via controlled switching devices to controlled power suplayers.

FIG. 12 shows, schematically and in an end view, the magnet system 70 of a nuclear-spin tomograph that generates the field $B_o$ perpendicular to the drawing plane of FIG. 12. Located in the bore 72 of the magnet system is a plastic tube (not depicted in order to simplify the drawing) on which are placed gradient coils 73 to generate the X gradient, gradient coils 74 to generate the Y gradient, and gradient coils 75 to generate the Z gradient. In the example, the coils shown in FIG. 1 are provided as the gradient coils 75 for the Z gradient. The total of eight terminals for the individual layers S1 and S2 of the two coils labeled with the letters A and B in FIG. 1 are connected by means of an eight-conductor cable 78, which is shown in highly simplified fashion in the drawing, to eight outputs of a controllable switching device 79. One control input of the switching device 79 is connected to one control output of a pulse control unit 80. The switching device 79 is connected via two lines to a controllable power supply 82, the control input of which is also connected to one output of the pulse control unit 80. Similarly, the coils for the X gradient and the Y gradient are connected via eight-conductor cables 83 and 84 to controllable switching devices 85 and 86 respectively, each of which is connected to a power supply 87 and 88 respectively. The switching devices 85 and 86 and the power supplies 87 and 88 are also controlled by the pulse control unit 80.

To generate the X gradient and Y gradient, four saddle coils—one pair of which is arranged one behind the other in the Z direction (i.e. perpendicular to the plane of the drawing), while the other pair lies opposite them—are used in a known manner for each of these gradients. In contradistinction to the prior art, these saddle coils are configured so that the saddle coils are subdivided into an inner and an outer winding zone; so that these inner winding zones of the two saddle coils of a pair for a specific gradient (X or Y gradient) are in each case connected to one another and have two terminals conveyed to the outside; and so that the outer winding zones or layers of that same pair are also connected to one another and have two terminals conveyed to the outside. The saddle coils for a particular gradient are thus subdivided in the same way as depicted in FIG. 1. The total of eight terminals of the saddle coils for the X gradient are connected to the switching device 85 and there—in exactly the same way as was explained for the coil arrangement of FIG. 1—can be switched in various ways in order to produce either a maximum gradient at maximum inductance and also a relatively long rise time, or a lower inductance with an enlarged linearity region and a shorter rise time. The same applies to the coils 74 which generate the Y gradient, which essentially differ from the coils for the X gradient only in that they are arranged at a 90° offset with respect to the Z axis.

A calculating device 100, which also controls the pulse control device 80, receives, in a known manner, measurement signals from the magnetically resonating molecules of a sample being measured, and allows the measurement results to be displayed as an image on the screen 110 of a viewing device.

The pulse control unit 80 controls the power supplies 87, 88, 82 in accordance with their particular requirements, and also controls the particular required switch setting of the switching devices 85, 86, 79 in accordance with their particular demands. It is thus possible, even within a single measurement which may have a total duration of a few seconds, to switch on the power supplies (in a known manner) on a pulsed basis, with the direction of the current also capable of being reversed if necessary; and depending on the requirements, controlled actuation of the switching devices can also ensure that, in accordance with the particular demands, the individual gradients are, for example, either as strong as possible and at the same time sufficiently linear, or relatively weak and highly linear; in the latter case, it is also possible to have a shorter rise time for the currents in the individual gradient coils and therefore for the gradient field.

Figure 13A:
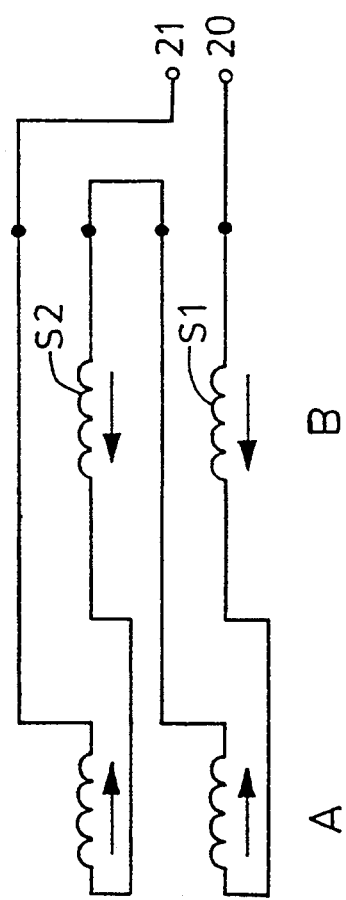
FIG. 13a-b shows further circuits supplementing FIGS. 1 and 2.
Figure 13B:
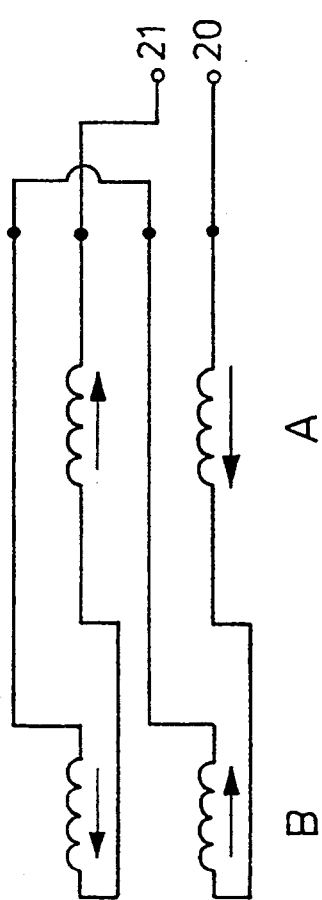

FIG. 13a shows a variant of the circuit according to FIG. 2a, resulting in the same gradient strength as in FIG. 2a (assuming the same coils and the same current are used). Here both winding zones S1 are directly electrically connected in a manner that is not easily disconnected, and the same is true for the connection between the two winding zones S2. This also applies to the circuit shown in FIG. 13b, in which, however, the gradient strength is lower, since in this case the current that flows serially through all the winding zones S1 and S2 passes through the zones S2 in the opposite direction from zones S1.

The aforesaid differing gradients can be different in each case depending on whether a stratification gradient, a dephasing gradient, or a readout gradient needs to be generated.

If necessary, coils that produce a quasi-continuous profile for the current density on a cylindrical enveloping surface can be used for the gradient coils. An example of such minimum inductance coils is described in EP-A-320 285 and in Robert Turner, Minimum inductance coils, J. Phys. E: Sci. Instrum., 21 (1988) pages 948–952.

What is claimed is:

1. System for the generation of magnetic gradient fields intermittently overlapping a static magnetic field of a nuclear-spin tomograph comprising:

means for generating, in a predefined volume under examination, a gradient magnetic field that varies, in an essentially linear fashion with position, said means for generating including at least one of a first pair of gradient coils, (A, B) and a second pair of gradient coils (C, D) with each coil of a pair having a first winding zone (S1) for generating a first, essentially linear, winding zone gradient field having a zone gradient direction and a second winding zone (S2) for generating a second, essentially linear, winding zone gradient field having the same zone gradient direction, each winding zone having a separate pair of terminals;

a single gradient power supply connected in series with each pair of gradient coils; and means for connecting and separating the winding zones to and from one another and to and from the single gradient power supply via the terminals, to generate the first and the second winding zone gradient fields.

2. System according to claim 1 wherein said gradient power supply is configured for intermittently generating a first and a second electrical current, and said means for connecting and separating the winding zones is operative for delivering the first current and the second current to at least one of the first and the second pair of winding zones, whereby the first current generates a first current gradient field and the second current generates a second current gradient field.

3. System according to claim 2, wherein the second current flows through only one of the first and the second pair of winding zones.

4. System according to claim 2, wherein the first current through one of the first and the second pair of winding zones flows in a first current direction with is opposite to a second current direction of the second current flowing through another pair of winding zones.

5. System according to claim 4, wherein an absolute value of the first and the second currents is identical.

6. System according to claim 2, wherein the first current flows in series through the first and the second winding zones.

7. System according to claim 2, wherein the second current flows in series through the first and the second winding zones and the terminals of one of the first and the second winding zones are transposed so that the second current through the transposed winding zone is directed oppositely to the first current through this winding zone.

8. System according to claim 6 wherein the first winding zones of each pair of gradient are permanently connected to one another in series, and wherein the second winding zones of each pair of gradient coils are permanently connected to one another in series.

9. System according to claim 1 wherein the gradient coils are subdivided into sets having at least two gradient set directions oriented orthogonally to one another.

10. System according to claim 9, wherein the gradient coils that are each subdivided into sets have three gradient set directions that are orthogonal to one another, and wherein a gradient set direction of one gradient set runs at least approximately parallel to a direction of the static magnetic Field.

11. System according to claim 1 wherein the means for connecting and separating the winding zones includes a switching device.

12. System according to claim 11, wherein the switching device is controllable.

13. System according to claim 2 wherein the first and the second currents are selected so that the first current gradient field is largely compensated for in an outer volume of the gradient-generation system and the second current gradient field comprises at least one of the first zone gradient field and the second zone gradient field.

14. System according to claim 1, wherein the first pair of gradient coils (A, B) and the second pair of gradient coils (C, D) have a different radius.

15. System according to claim 1 wherein the first gradient coil pair (A, B) and the second gradient coil pair (C, D) have the same radius and are arranged behind one another in an axial direction of the gradient coil pairs.

16. System according to claim 1 wherein the gradient coil pair comprises saddle coils subdivided into sets.

17. System according to claim 1 wherein the gradient coils pair is subdivided into sets, and wound so that an essentially continuous profile for current density exists therein over a cylindrical enveloping surface.

18. A system for generating magnetic gradient fields intermittently overlapping a static magnetic field of a nuclear-spin tomograph, said system comprising:
first gradient coil means (A, B), having a first winding zone (S1) with a pair of terminals, for generating a first, essentially linear, winding zone gradient field having a zone gradient direction;
second gradient coil means (C,D), having a second winding zone (S2), with a separate pair of terminals, for generating a second, essentially linear, winding zone gradient field having a zone gradient direction the same as the first winding zone gradient field;
a single gradient power supply connected in series with the first and second gradient coil means; and
switching means for connecting and separating the first and second winding zones, via the corresponding pair of terminals, in one of a number of configurations to and from the single gradient power supply in order to generate, in a predefined volume under examination, a gradient magnetic field that varies in an essentially linear fashion with position.

19. A system for generating magnetic gradient field intermittently overlapping a static magnetic field of a nuclear-spin tomograph, said system comprising:
first gradient coil means (A,B), having a first winding zone (S1) with a pair of terminals, for generating a first, essentially linear, winding zone gradient field having a zone gradient direction;
second gradient coil means (C,D), having a second winding zone (S2) with a separate pair of terminals, for generating a second, essentially linear, winding zone gradient field having a zone gradient direction the same as the first winding zone gradient field;
a single gradient power supply connected in series with the first and second gradient coil means; and
switching means for selectively controlling a rise time and gradient strength and self-shielding of a generated linear gradient magnetic field by connecting and separating the first and second winding zones via the corresponding pair of terminals, in one of a number of configurations to and from the single gradient power supply in order to generate a gradient magnetic field that varies in an essentially linear fashion with position.

* * * * *